(12) United States Patent
Lee

(10) Patent No.: US 7,011,992 B2
(45) Date of Patent: Mar. 14, 2006

(54) METHOD OF FABRICATING A THIN FILM TRANSISTOR USING DUAL OR MULTIPLE GATES

(75) Inventor: Ki Yong Lee, Suwon (KR)

(73) Assignee: Samsung SDI Co., Ltd., Suwon-si (KR)

(*) Notice: Subject to any disclaimer, the term of this patent is extended or adjusted under 35 U.S.C. 154(b) by 171 days.

(21) Appl. No.: 10/677,278

(22) Filed: Oct. 3, 2003

(65) Prior Publication Data

US 2004/0077132 A1 Apr. 22, 2004

(30) Foreign Application Priority Data

Oct. 21, 2002 (KR) ............... 10-2002-0064366

(51) Int. Cl.
*H01L 21/00* (2006.01)

(52) U.S. Cl. .................... 438/149; 438/150

(58) Field of Classification Search .......... 438/149, 438/150
See application file for complete search history.

(56) References Cited

U.S. PATENT DOCUMENTS

| 6,177,301 B1 * | 1/2001 | Jung ................... 438/150 |
| 6,590,230 B1 * | 7/2003 | Yamazaki et al. ........ 257/72 |
| 6,720,578 B1 * | 4/2004 | Lee ..................... 257/64 |
| 6,759,679 B1 * | 7/2004 | Lee ..................... 257/66 |
| 6,825,494 B1 * | 11/2004 | Lee et al. ............... 257/64 |

FOREIGN PATENT DOCUMENTS

WO    WO 97/45827    12/1997

* cited by examiner

*Primary Examiner*—Christian D. Wilson
(74) *Attorney, Agent, or Firm*—Stein, McEwen & Bui, LLP

(57) ABSTRACT

The present invention relates to a method for fabricating a TFT using dual or multiple gates, and provides a TFT having superior characteristics and uniformity by providing a method for fabricating a TFT using dual or multiple gates comprising the steps of calculating probability including Nmax the maximum number of crystal grain boundaries in active channel regions according to the length of the active channels, and adjusting gap between the active channels capable of synchronizing the number of the crystal grain boundaries in each active channel regions of the TFT using the dual or multiple gates in case that Gs size of crystal grains of polycrystalline silicon forming a TFT substrate, θ angle in which "primary" crystal grain boundaries are inclined to a direction perpendicular to an active channel direction of the gates, width of the active channels and length of the active channels are determined.

15 Claims, 11 Drawing Sheets

METHOD OF FABRICATING A THIN FILM TRANSISTOR USING DUAL OR MULTIPLE GATES

CROSS-REFERENCE TO RELATED APPLICATIONS

This application claims the benefit of Korean Application No. 2002-64366, filed Oct. 21, 2002, in the Korean Intellectual Property Office, the disclosure of which is incorporated herein by reference.

BACKGROUND OF THE INVENTION

1. Field of the Invention

The present invention relates to a method of fabricating a thin film transistor using dual or multiple gates, and more particularly, to a method of fabricating a thin film transistor using dual or multiple gates which is capable of improving uniformity of the thin film transistor using a polycrystalline silicon thin film by using the dual or multiple gates.

2. Description of the Related Art

Bonding defects such as atom dangling bonds existing on the crystal grain boundaries of polycrystalline silicon included in active channel regions are known to act as traps on electric charge carriers when fabricating a thin film transistor (hereinafter referred to as a TFT) using polycrystalline silicon.

Therefore, size, size uniformity, number and position, and direction of crystal grains not only directly or indirectly exert a fatal influence on the TFT characteristics such as threshold voltage (Vth), subthreshold slope, charge carrier mobility, leakage current and device stability, but also exert a fatal influence on uniformity of the TFT depending on the position of the crystal grains when fabricating an active matrix display substrate using the TFT.

The number of fatal crystal grain boundaries (hereinafter referred to as "primary" crystal grain boundaries) included in active channel regions of a TFT on the whole substrate of a display device can be equal to or different from each other depending on the size of crystal grains, the inclination angle θ, the dimension of active channels (length (L), width (W)) and position of each TFT on the substrate, as illustrated in FIG. 1A and FIG. 1B.

As illustrated in FIG. 1A and FIG. 1B, the number of "primary" crystal grain boundaries that can be contained in an active channel region for the crystal grain size Gs, the active channel dimension L×W and the inclination angle θ is Nmax (2 in case of FIG. 1A) or (Nmax−1) (3 in case of FIG. 1B) when the number of the maximum crystal grain boundaries is Nmax, and the most superior uniformity of the TFT characteristics can be obtained when Nmax "primary" crystal grain boundaries are contained in the active channel region for all TFTs. Accordingly, the more each of the TFTs have an equal number of crystal grain boundaries, the more superior uniformity a device has.

On the other hand, it can be easily expected that uniformity is the worst in characteristics of TFTs on a TFT substrate or a display device if the number of TFTs including Nmax "primary" crystal grain boundaries is equal to the number of TFTs including (Nmax−1) "primary" crystal grain boundaries.

Polycrystalline or single crystalline particles can form large silicon grains on a substrate using sequential lateral solidification (SLS) crystallization technology, as illustrated in FIG. 2A and FIG. 2B. It has been reported that a TFT fabricated using the large silicon grains can obtain the similar characteristics to that of a TFT fabricated using single crystalline silicon.

However, numerous TFTs used in a driver and a pixel array should be fabricated in order to fabricate an active matrix display.

For example, approximately a million pixels are required in fabricating an active matrix display having super video graphics array (SVGA) resolution, one TFT is required in each pixel in the case of a liquid crystal display (LCD), and two or more TFTs are required in each pixel in a display device using an organic light emitting substance, e.g. an organic electroluminescent device.

Therefore, it is impossible to fabricate the TFTs by growing a certain number of crystal grains only in one to two million or more active channel regions of each TFT in a certain direction.

In order to supplement the problems, it is disclosed in PCT International Patent NO. WO 97/45827 that the amorphous silicon on the whole substrate is converted into polycrystalline silicon, or only selected regions on the substrate are crystallized using SLS technology after depositing amorphous silicon by plasma enhanced chemical vapor deposition (PECVD), low pressure chemical vapor deposition (LPCVD) or sputtering (FIG. 2A and FIG. 2B).

The selected regions are also considerably wide regions compared with active channel regions having a dimension of several μm×several μm. Furthermore, the size of a laser beam used in SLS technology is approximately several μm×several μm so that stepping and shifting of the laser beam or the stage are inevitably required to crystallize amorphous silicon of the whole regions or selected regions on a substrate, wherein misalignment exists between regions on which the laser beam is irradiated. Therefore, the number of "primary" crystal grain boundaries included in numerous active channel regions of a TFT is varied, and the TFT on the whole substrate, in driver regions or in pixel cell regions has unpredictable non-uniformity. The non-uniformity can exert a fatal influence on the realization of an active matrix display device.

Furthermore, it is disclosed in U.S. Pat. No. 6,177,301 that the barrier effect of crystal grain boundaries for the direction of an electric charge carrier is minimized (FIG. 3A), and TFT characteristics being second to single crystalline silicon is obtained accordingly in the case where the direction of active channels is parallel to the direction of crystal grains grown by the SLS crystallization method when fabricating a TFT for an LCD comprising driver and pixel arrays by forming large silicon grains using SLS crystallization technology while a lot of crystal grain boundaries in which the TFT characteristics acts as a trap for the electric charge carriers exist, and the TFT characteristics is greatly deteriorated in the case where the active channel direction is perpendicular to the crystal grain growing direction (FIG. 3B).

There are cases where TFTs inside the driver circuit and TFTs inside pixel cell regions usually have an angle of 90° when actually fabricating an active matrix display, wherein uniformity of the device can be improved by fabricating the active matrix display in such a way that a direction of the active channel region is inclined at a growing angle of the crystal grains at an angle of 30 to 60° to improve uniformity of characteristics between TFTs, while not greatly deteriorating characteristics of each TFT as illustrated in FIG. 3C.

However, there is a probability that fatal crystal grain boundaries are included in the active channel regions as the method also uses crystal grains of a limited size formed by the SLS crystallization technology. Accordingly, the method has problems in that unpredictable non-uniformity causing a difference of characteristics between TFTs exists.

SUMMARY OF THE INVENTION

To overcome the problems described above, it is an aspect of the present invention to provide a method of fabricating a TFT using dual or multiple gates in which a probability including the number of fatal crystal grain boundaries in an active channel region is calculated, and uniformity of the TFT for a local part on the total substrate can be improved when fabricating the TFT using silicon grains in a crystal growing direction of which is constantly regularized.

Additional aspects and advantages of the invention will be set forth in part in the description which follows and, in part, will be obvious from the description, or may be learned by practice of the invention.

The foregoing and/or other aspects of the present invention are achieved by providing a method of fabricating a TFT using dual or multiple gates comprising: calculating a probability including Nmax, the maximum number of crystal grain boundaries in active channel regions according to the length of the active channels, and adjusting a gap between the active channels capable of synchronizing the number of the crystal grain boundaries in each active channel region of the TFT using the dual or multiple gates in the case where Gs, the size of crystal grains of polycrystalline silicon forming a TFT substrate, the θ angle in which "primary" crystal grain boundaries are inclined at a direction perpendicular to an active channel direction of the gates, the width of the active channels and the length of the active channels are determined.

The angle is $-45° \leq \theta \leq 45°$, and the gap between the active channels is adjusted so that the probability does not become 0.5.

BRIEF DESCRIPTION OF THE DRAWINGS

These and other aspects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1A:
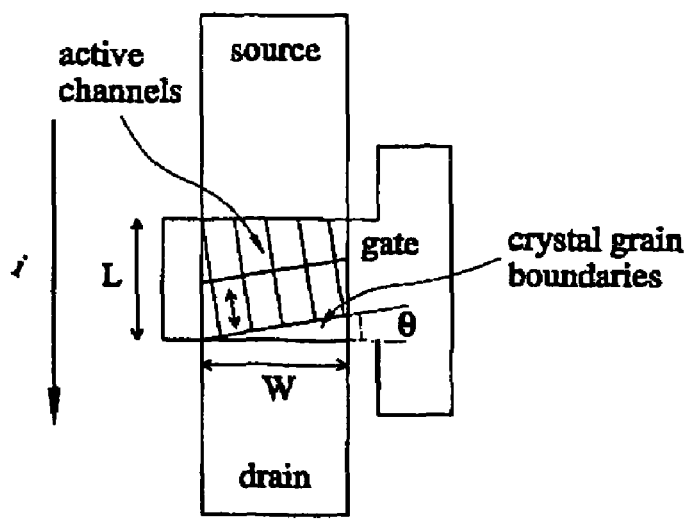
FIG. 1A is a cross-sectional view schematically illustrating a TFT in which the number of fatal crystal grain boundaries is 2 for an equal crystal grain size Gs and an active channel dimension L×W.
Figure 1B:
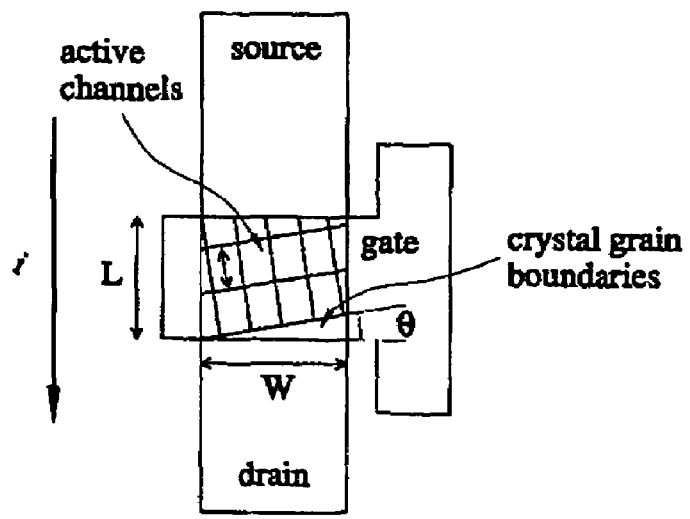
FIG. 1B is a cross-sectional view schematically illustrating a TFT in which the number of fatal crystal grain boundaries is 3.
Figure 2A:
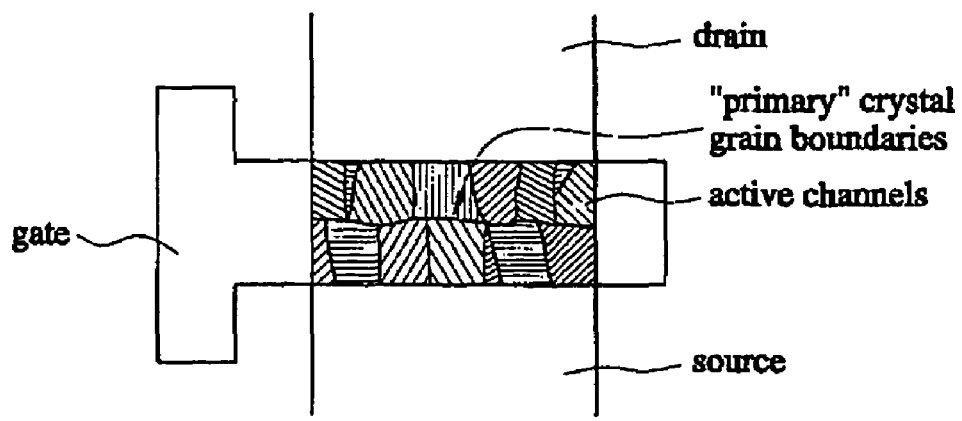
FIG. 2A and FIG. 2B are cross-sectional views schematically illustrating active channels of a TFT comprising silicon grains having a large particle size formed by sequential lateral solidification (SLS) crystallization according to a prior art.
Figure 2B:
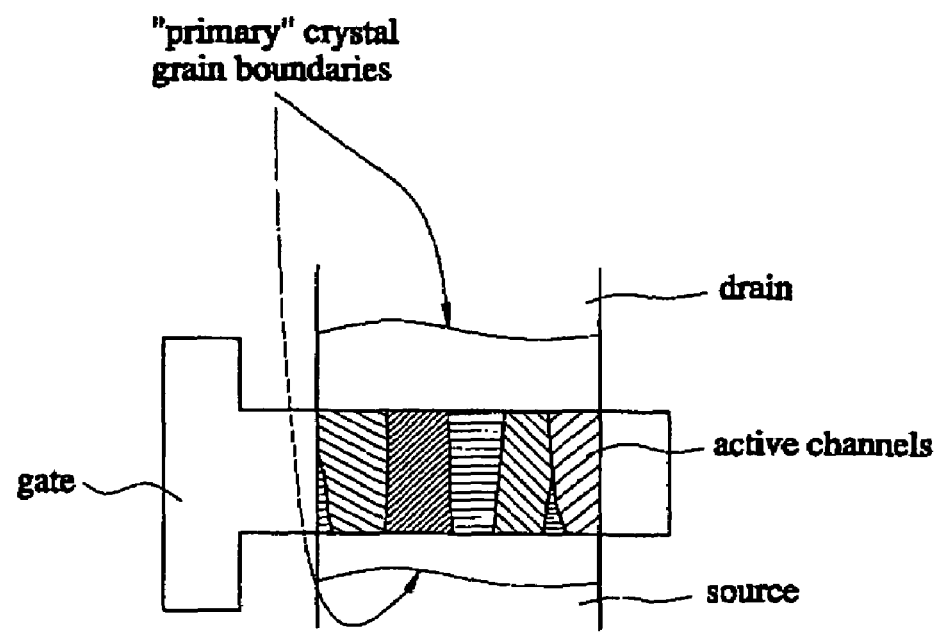
Figure 3A:
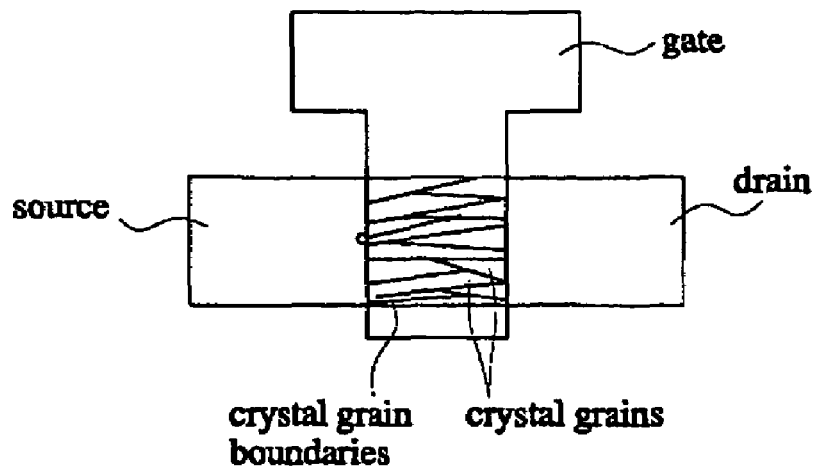
FIG. 3A to FIG. 3C are other cross-sectional views schematically illustrating active channels of a TFT fabricated according to the prior art.
Figure 3B:
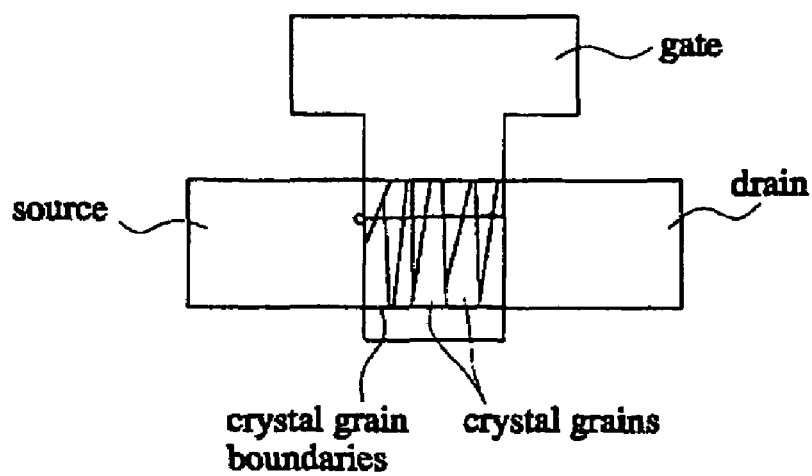
Figure 3C:
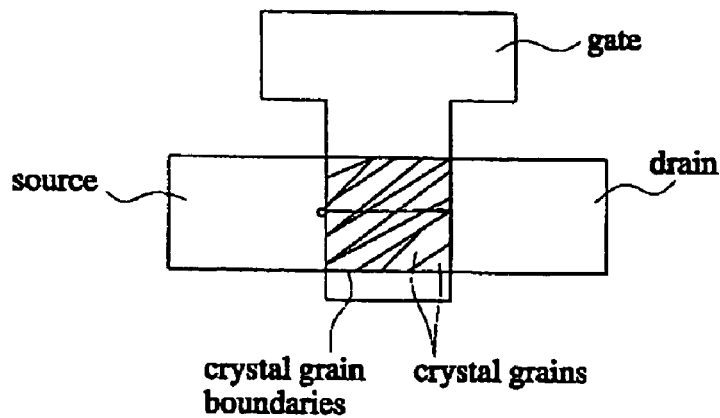

Reference will now be made in detail to the present preferred embodiments of the present invention, examples of which are illustrated in the accompanying drawings, wherein like reference numerals refer to like elements throughout.

A crystal grain boundary is formed between neighboring crystal grains due to a limited size of the crystal grains in the case in which crystal grains of polycrystalline silicon directly and indirectly exerting an important influence on TFT characteristics are enlarged and regularized to improve the TFT characteristics when fabricating a TFT for an active matrix display device.

"Crystal grain size" in the present invention refers to the distance between confirmable crystal grain boundaries, and is generally defined as the distance between the crystal grain boundaries belonging to an error range.

Particularly, a crystal grain boundary exerting a fatal influence on TFT characteristics when the crystal grain boundary exists in an active channel region, namely, a "primary" crystal grain boundary in which an inclined angle of the crystal grain boundary at a direction perpendicular to an active channel direction is $-45° \leq \theta \leq 45°$, results in inevitable defects due to the limit of processing accuracy during formation of a polycrystalline silicon thin film.

Figure 4:
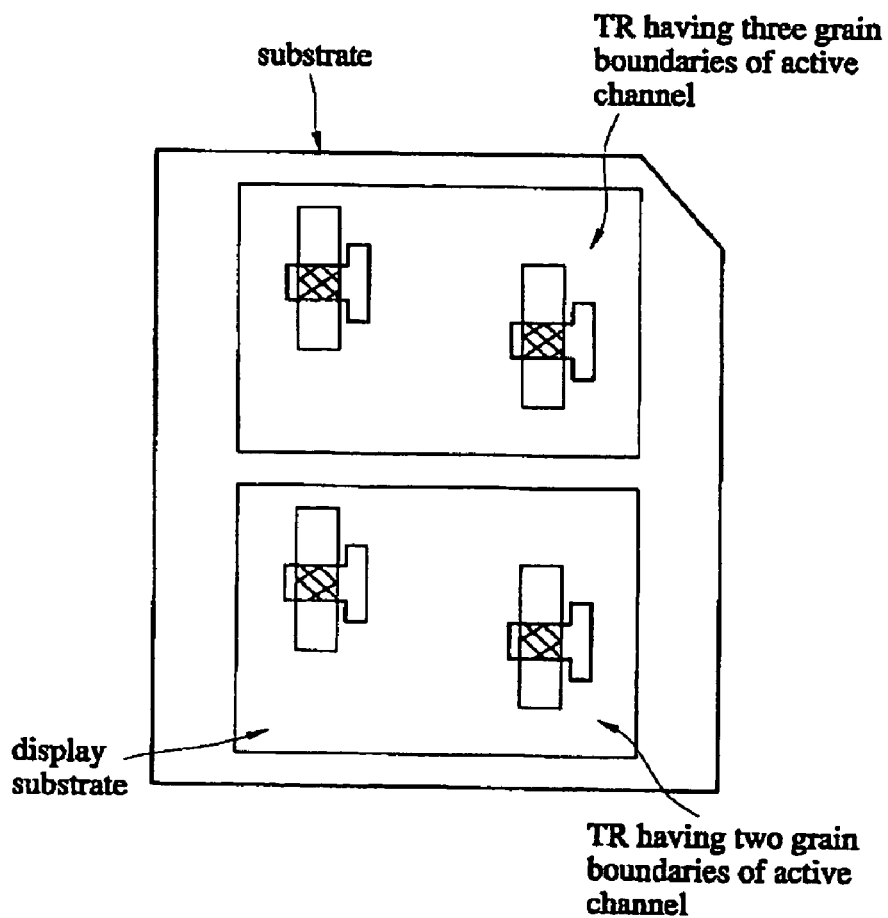
FIG. 4 is a schematic drawing showing that the number of fatal crystal grain boundaries capable of exerting a fatal influence on characteristics of a TFT fabricated on a driving circuit substrate or a display can be varied depending on the position of the TFT.

The number of the "primary" crystal grain boundaries included in a TFT active channel region fabricated on a driving circuit substrate or display region may be varied depending on the size and the direction of the crystal grains, and the dimension of the active channels, as illustrated in FIG. 4. Therefore, characteristics of a TFT and a display region that are fabricated becomes non-uniformed, or worse yet, the TFT and display region may not be driven at all.

The present invention provides the most preferable process conditions and TFT dimensions by calculating a probability "P" in which Nmax, the maximum number of "primary" crystal grain boundarstics capable of judging uniformity in TFT characterstics during fabrication of a TFT substrate using large silicon grains are included in active channel regions on the total substrate of a display device, and a probability "Q" in which (Nmax−1) "primary" crystal grain boundaries are included in the active channel regions on the total substrate of the display device, and by using the dual or multiple gates using the probabilities, thereby judging optimum process conditions on size and direction of silicon crytsal grains and optimum dimensions of the active channels to secure uniformity of the TFT characteristics required when fabricating a TFT substrate and an active display device.

If the probability in which Nmax, the maximum number of "primary" crystal grain boundaries are included in active channel regions of a TFT on a display device substrate or a driving circuit substrate is "P," then "Q," the probability in which (Nmax−1) "primary" crystal grain boundaries are included in the active channel regions of the TFT, will be (1−P).

Therefore, it is defined that P+Q=1, and P=(a+b)/Gs.

Figure 6A:
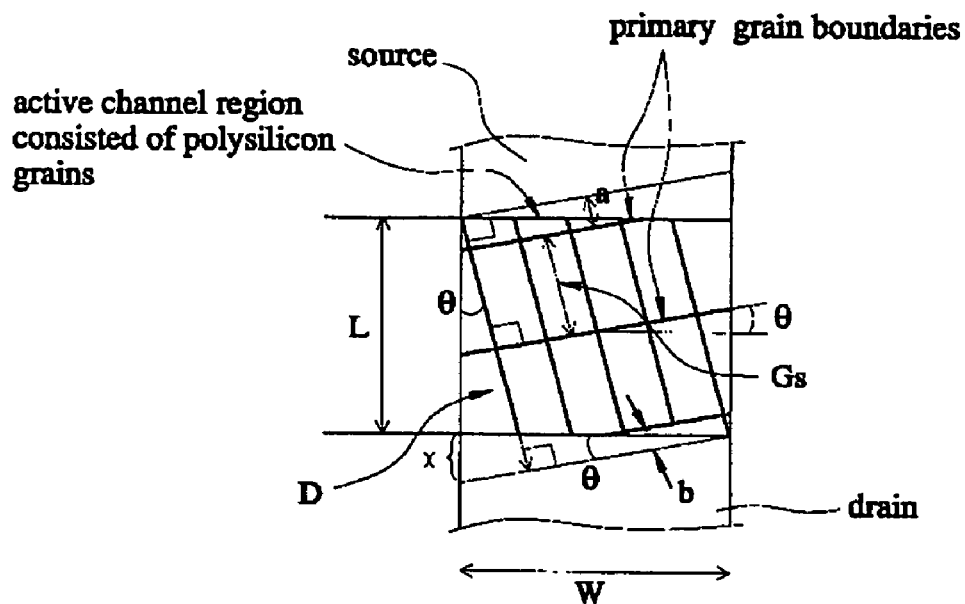
FIG. 6A and FIG. 6B are drawings which aid in calculating the probability in which the maximum number or the maximum number-1 "primary" crystal grain boundaries are included in active channel regions in the structure of a TFT using polycrystalline silicon having ordinary crystal grain boundaries that are not perpendicular to directions of the source/drain in the active channel regions.

As shown in FIG. 6A, a+b is a remaining distance from which a distance occupying (Nmax−1) crystal grains in a direction of the major axis is subtracted, and Gs is the size of the crystal grains in a direction of the major axis.

Figure 5A:
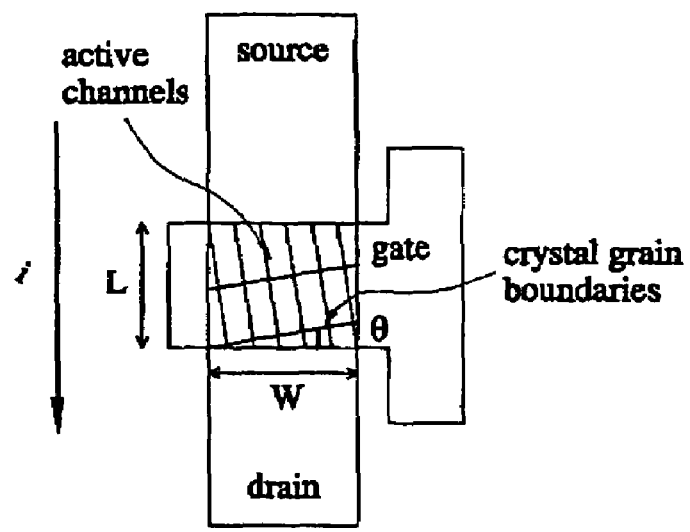
FIG. 5A and FIG. 5C are cross-sectional views schematically illustrating the structure of a TFT using polycrystalline silicon having crystal grain boundaries which are not perpendicular to directions of the source/drain in active channel regions of the TFT.
Figure 5B:
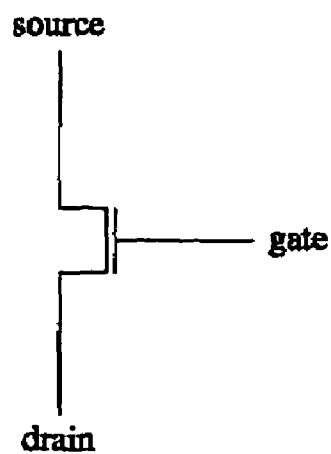
FIG. 5B is a schematic diagram equivalent to the TFT.
Figure 5C:
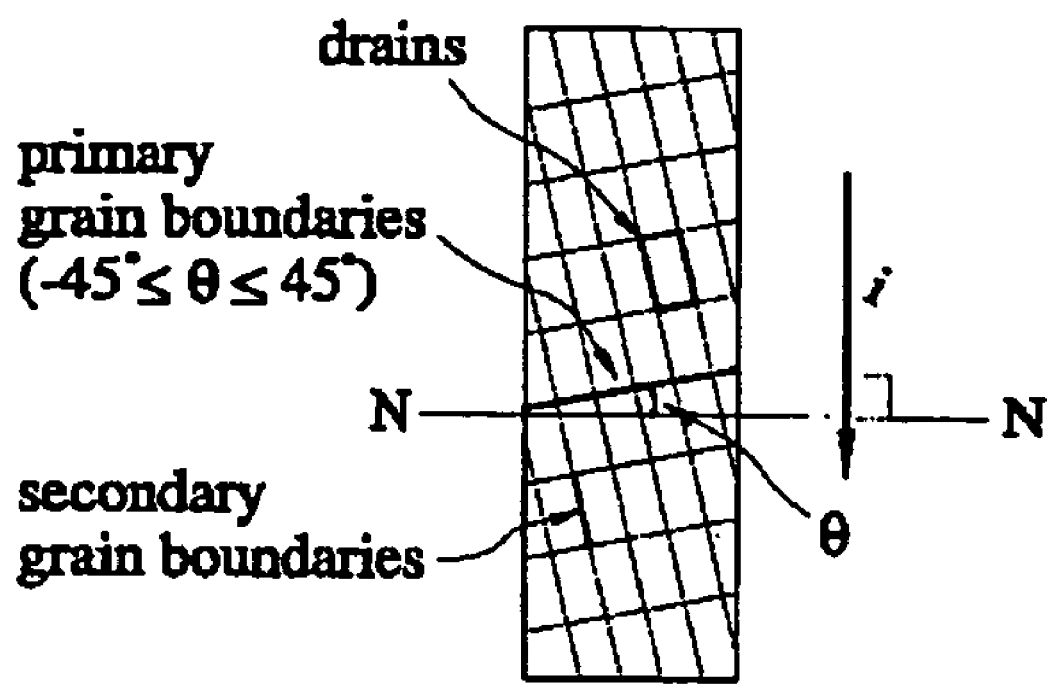

On the other hand, as shown in FIG. 5C, if a normal line to a source/drain direction is NN', boundaries between neighboring crystal grains in a major axis direction of the crystal grains are "primary" crystal grain boundaries, and an angle θ between the normal line NN' and the "primary" crystal grain boundaries is $-45° \leq \theta \leq 45°$.

A distance perpendicular to the "primary" crystal grain boundaries for active channel regions having a length L and a width W, that is, the maximum distance D in the active channel regions can be represented as follows by a simple trigonometrical function (FIG. 5A).

$$D=(L+x)\times\cos\theta$$

where $x=W\times\tan\theta$.

Since $D=(L+W\times\tan\theta)\times\cos\theta=L\cos\theta+W\tan\theta\cos\theta$, and $\tan\theta\cos\theta$ is $\sin\theta$, D can be rewritten as $D=L\times\cos\theta+W\times\sin\theta$. Therefore, the maximum distance D can be represented as functions of length L and width W of the active channel regions, and an inclined angle θ of the "primary" crystal grain boundaries for the normal line NN'.

If the major axis directional size of crystal grains is Gs, and the maximum number of the "primary" crystal grain boundaries included in the active channel regions is Nmax, Nmax can be obtained by the following numerical expression.

$$N\text{max}=\xi(D/Gs)$$

where function $\xi$ can be defined as following expression.

$$\xi(x)=\text{minimum integral number}\geq x,$$

where x is an arbitrary number.

That is, it can be seen that $\xi$ is a function in which Nmax=2 when x=2 while Nmax=3 when x=2.3.

Figure 6B:
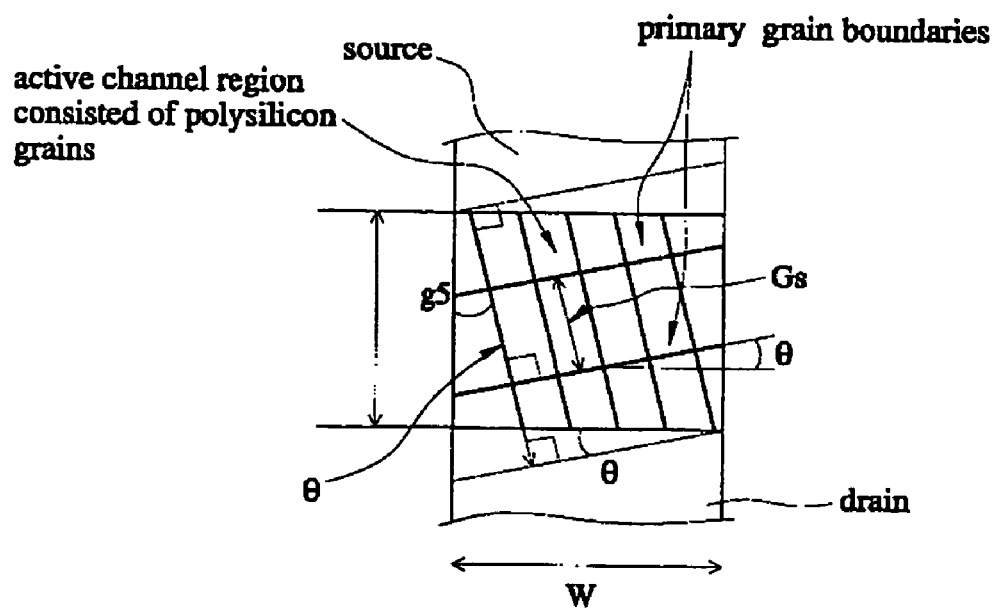

On the other hand, referring to FIG. 6A and FIG. 6B, a+b=D−(Nmax−1)×Gs, and the probability "P" can be represented as the following expression 1.

$$P=(D-(N\text{max}-1)\times Gs)/Gs, \quad \text{Expression 1]}$$

and the probability "Q" can be represented as the following expression 2.

$$Q=1-P=1-(D-(N\text{max}-1)\times Gs/Gs)=(-D+N\text{max}\times Gs)/Gs. \quad \text{Expression 2]}$$

As described above, only Nmax or Nmax−1 "primary" crystal grain boundaries exist in the active channel regions, and the physical meaning of the probability P represented by the above expression can be reviewed as follows based thereon.

a) In Case of P=0

The probability in which the maximum number Nmax of (Nmax−1) "primary" crystal grain boundaries is included in active channel regions is 0. Therefore, only the number of (Nmax−1) "primary" crystal grain boundaries can exist in the active channel regions.

b) In Case of 0<P<0.5

The probability in which the number of Nmax "primary" crystal grain boundaries can exist in the active channel regions is lower than the probability in which the number of (Nmax−1) "primary" crystal grain boundaries can exist in the active channel regions.

In Case of P=0.5

The probability in which the number of Nmax "primary" crystal grain boundaries is included in the active channel regions is the same as the probability in which the number of (Nmax−1) "primary" crystal grain boundaries is included in the active channel regions.

d) In Case of 0.5<P<1

The probability in which the number of Nmax "primary" crystal grain boundaries is included in the active channel regions is the same as the probability in which the number of (Nmax−1) "primary" crystal grain boundaries is included in the active channel regions.

In case of P=1

The probability in which the maximum number Nmax of "primary" crystal grain boundaries is included in the active channel regions is 1. Therefore, only the number of Nmax "primary" crystal grain boundaries can exist in the active channel regions.

It can be seen that the uniformity of the TFT in a driving circuit substrate or an active matrix TFT display device due to the difference of the number of "primary" crystal gain boundaries included in active channel regions is the worst in case of P=0.5, and the most superior in case of P=0 or P=1 when fabricating a TFT using polycrystalline silicon in which a major axis directional size of crystal grains is Gs from the meaning of the probability P.

However, it is not easy to obtain the probability of P=0 or P=1 due to a process margin during wet type or dry type etching of a gate metal to form active channels, and a silicon crystallization process can be performed to design a TFT to give size and the direction of the crystal grains or fabricate a polycrystalline thin film in accordance with designing of the required TFT based on the range of probability P capable of securing uniformity of TFT characteristics required for realization of the active matrix display, $0\leq P\leq 0.25$ or $0.75\leq P\leq 1$, in fabricating an actual TFT substrate using polycrystalline silicon.

Numerical Expression in the Case of θ=0°

Figure 7A:
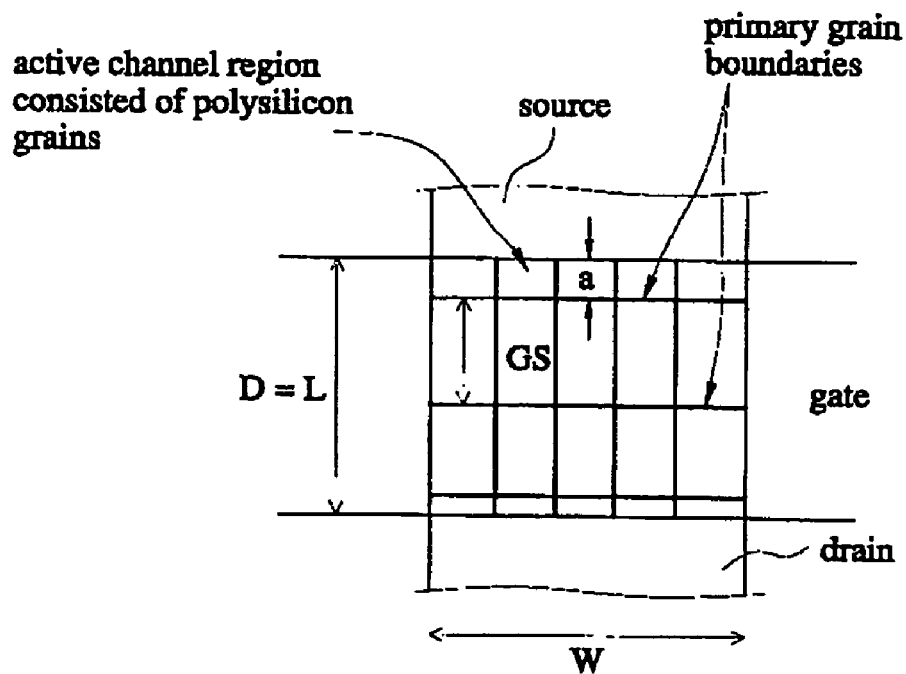
FIG. 7A and FIG. 7B are drawings which aid in calculating the probability in which the maximum number or the maximum number-1 "primary" crystal grain boundaries are included in active channel regions in the structure of a TFT using polycrystalline silicon having crystal grain boundaries that are perpendicular to directions of the source/drain in the active channel regions.
Figure 7B:
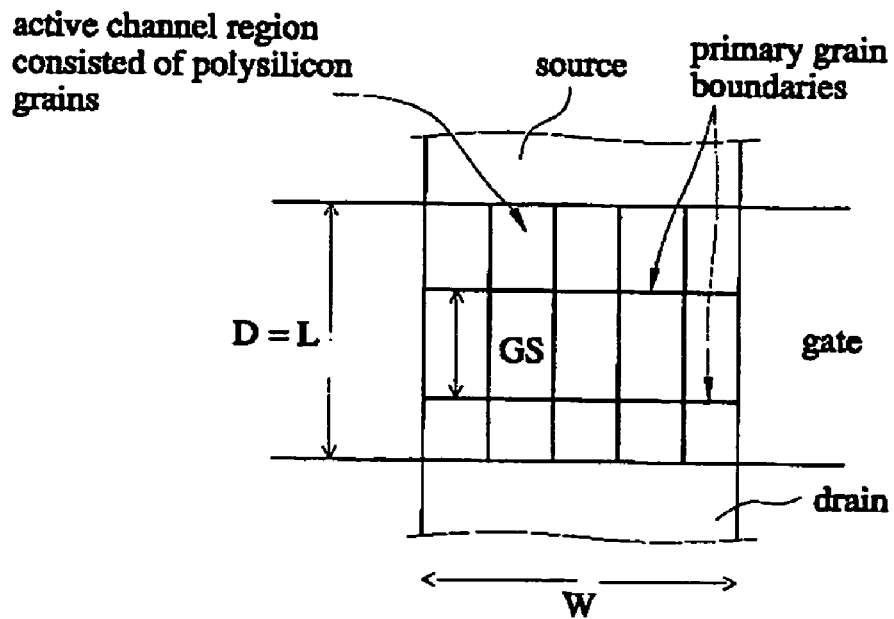

In FIG. 7A and FIG. 7B, D=L for the expression showing the probability P, the probability P is no longer a function of W and θ, wherein the probability P can be represented as follows:

$$P=(L-(N\text{max}-1)\times Gs)/Gs$$

wherein as the probability Q in which the number of (Nmax−1) "primary" crystal grain boundaries is included in active channel regions is P+Q=1, $$Q=1-P=\{1-(L-(Nma-1)\times Gs)\}/Gs=(-L+Nmax\times Gs)/Gs.$$

As described above, the uniformity of a fabricated TFT substrate can be predicted by calculating the probability in which the "primary" crystal grain boundaries exerting a fatal influence on TFT characteristics for any combination of active channel dimension and size and direction of crystal grains using the Expression 1, and silicon crystallization process is established, or the structure of a TFT is designed to obtain optimum uniformity accordingly.

The defined expression is valid, and an optimum TFT capable of calculating the probability in which the crystal grain boundaries are included in active channel regions and improving uniformity can be fabricated even in case where two large silicon crystal grains are formed on a substrate.

On the other hand, the TFT characteristics and the TFT uniformity can be improved by adjusting a gap between gates using dual or multiple gates instead of a single gate to further improve characteristics of a TFT and uniformity of the TFT at a local region.

That is, the spacing "S" between the gates to synchronize the number of "primary" crystal grain boundaries that is included in each channel at the TFT using the dual or multiple gates can be represented as in the following Expression 3.

$$S=mGs \sec \theta - L \qquad \text{Expression 3]}$$

where Gs is the size of crystal grains, m is an integral number larger than 0, θ is an angle in which fatal crystal grain boundaries ("primary" crystal grain boundaries) are inclined at a direction perpendicular to an active channel direction, and L is the length of active channels of each of the dual or multiple gates.

In the case of θ=0, sec θ=1. Therefore, S can be represented as S=mGs−L.

Figure 8A:
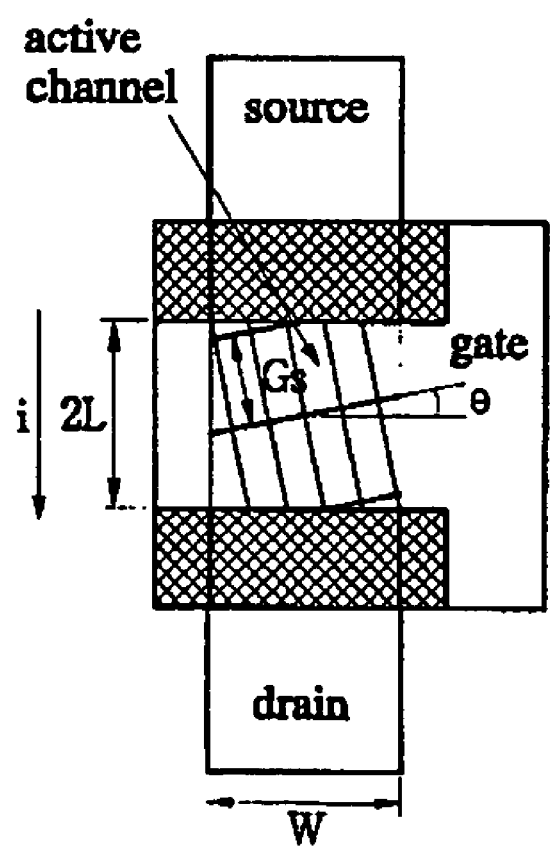
FIG. 8A is a drawing illustrating a single active channel TFT having an equal active channel length of 2L and crystal grain sizes of Gs.
Figure 8A:
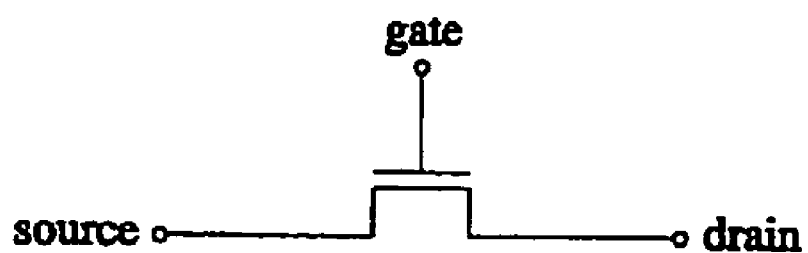
Figure 8B:
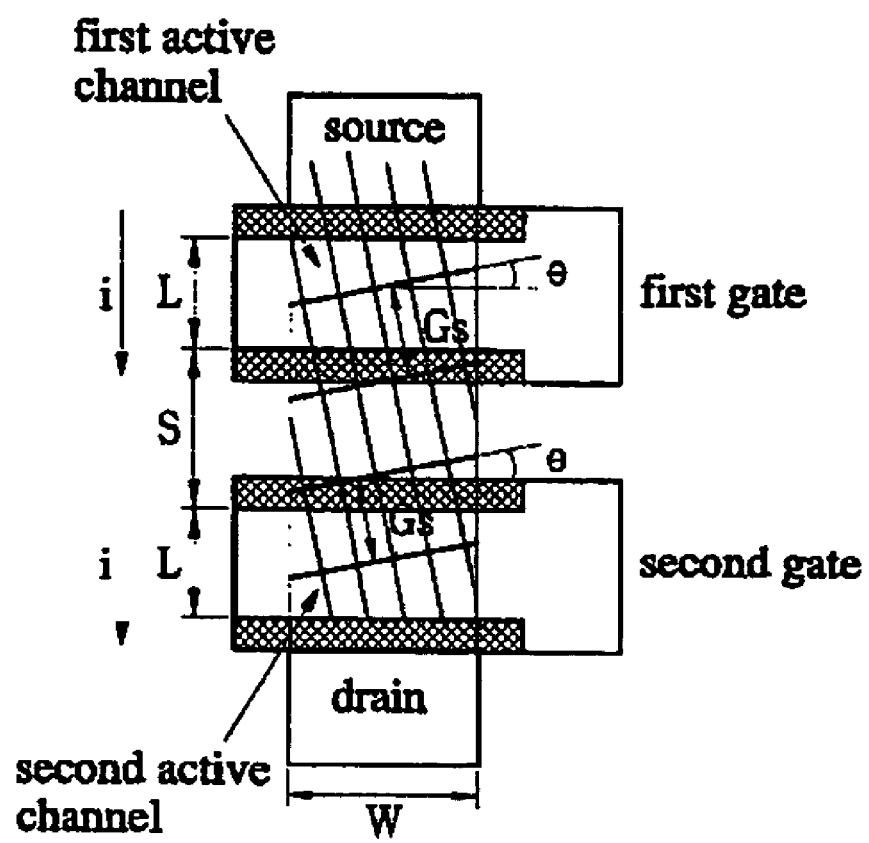
FIG. 8B is a drawing illustrating a dual active channel TFT having equal active channel length of 2L and crystal grain size of Gs.
Figure 8B:
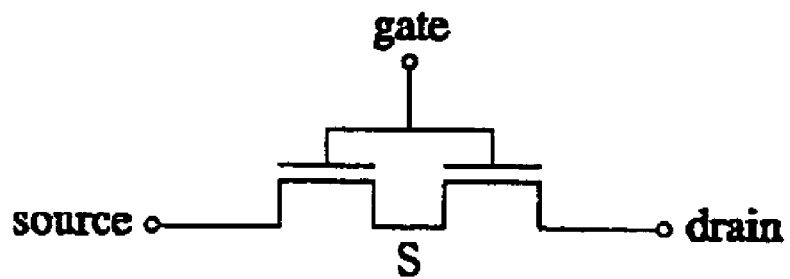

In the case of designing and fabricating a TFT using the gap between the gates calculated in Expression 3, for the size and the direction of crystal grains and the dimension of active channels given from the Expression 3, TFT characteristics are improved since the number of the "primary" crystal grain boundaries included in each of the active channel regions is reduced when fabricating a TFT using dual gates having the same active channel length as compared with fabricating a TFT using a single gate having an active channel length of 2L. Furthermore, uniformity can be secured by equally synchronizing the number of the "primary" crystal grain boundaries included in each of the active channel regions in the case of designing and fabricating a TFT using an "S" value calculated by Expression 3 as a gap between the gates (FIG. 8A and FIG. 8B).

In the present invention, characteristics and uniformity of a TFT can be improved by adjusting the gap between gates using dual or multiple gates after calculating the probability "P" in which the maximum number Nmax of "primary" crystal grain boundaries is included in active channel regions all over a substrate of a display device, and the probability "Q" in which the maximum number (Nmax−1) of "primary" crystal grain boundaries is included in the active channel regions all over the substrate of the display device.

Therefore, the most preferable processes can be proceeded by adjusting the gap between the dual or multiple gates after determining the number of crystal grain boundaries in actual processes according to the P value defined in the present invention, and the width, length or angle θ of the source/drain regions that are active channel regions of a TFT.

Furthermore, uniformity is improved so that characteristics of a device are improved in the case of a device using a TFT fabricated in the present invention. A semiconductor device or display device can be used as the device, and preferably a LCDI or EL is used as the display device.

One preferable example is suggested as follows to help understand the present invention. However, the following example is suggested only to help understand the present invention, and the present invention is not limited to the following example.

EXAMPLE 1

Example 1 exemplifies the probability P in which the maximum number Nmax of crystal grain boundaries is included in active channel regions according to a channel length L and a gap S between channels capable of synchronizing the number of crystal grain boundaries in each of the active channel regions of a TFT using dual or multiple gates in the case where the size of the crystal grains is Gs, θ is an inclined angle of "primary" crystal grain boundaries to a direction perpendicular to an active channel direction, and a channel width W is 10 μm.

The following Table 1 shows calculation results according to Example 1.

TABLE 1

| θ | Gs(μm) | L(μm) | Nmax | P | m | S |
|---|---|---|---|---|---|---|
| 0° | 0.4 | 1 | 3 | 0.500 | 3 | 0.2 |
| | | | | | 4 | 0.6 |
| | | 2 | 5 | 1.000 | 6 | 0.4 |
| | | | | | 7 | 0.8 |
| | | 3 | 8 | 0.500 | 8 | 0.2 |
| | | | | | 9 | 0.6 |
| | | 4 | 10 | 1.000 | 11 | 0.4 |
| | | | | | 12 | 0.8 |
| | | 5 | 13 | 0.500 | 13 | 0.2 |
| | | | | | 14 | 0.6 |
| 2° | 0.4 | 1 | 4 | 0.371 | 4 | 0.253 |
| | | | | | 5 | 0.653 |
| | | 2 | 6 | 0.869 | 6 | 0.054 |
| | | | | | 7 | 0.454 |
| | | 3 | 9 | 0.368 | 9 | 0.255 |
| | | | | | 10 | 0.655 |
| | | 4 | 11 | 0.866 | 11 | 0.056 |
| | | | | | 12 | 0.456 |
| | | 5 | 14 | 0.365 | 14 | 0.257 |
| | | | | | 15 | 0.658 |
| 5° | 0.4 | 1 | 5 | 0.669 | 5 | 0.140 |
| | | | | | 6 | 0.541 |
| | | 2 | 8 | 0.160 | 8 | 0.348 |
| | | | | | 9 | 0.750 |
| | | 3 | 10 | 0.650 | 10 | 0.155 |
| | | | | | 11 | 0.557 |
| | | 4 | 13 | 0.141 | 13 | 0.364 |
| | | | | | 14 | 0.765 |
| | | 5 | 15 | 0.631 | 15 | 0.170 |
| | | | | | 16 | 0.572 |
| 0° | 2.5 | 1 | 1 | 0.400 | 1 | 1.5 |
| | | | | | 2 | 4.0 |
| | | 2 | 1 | 0.800 | 1 | 0.5 |
| | | | | | 2 | 3.0 |
| | | 3 | 2 | 0.200 | 2 | 2.0 |
| | | | | | 3 | 4.5 |
| | | 4 | 2 | 0.600 | 2 | 1.0 |
| | | | | | 3 | 3.5 |
| | | 5 | 2 | 1.000 | 3 | 2.5 |
| | | | | | 4 | 5.0 |
| 2° | 2.5 | 1 | 1 | 0.539 | 1 | 1.153 |
| | | | | | 2 | 3.655 |
| | | 2 | 1 | 0.939 | 1 | 0.154 |
| | | | | | 2 | 2.655 |
| | | 3 | 2 | 0.339 | 2 | 1.656 |

TABLE 1-continued

| θ | Gs(μm) | L(μm) | Nmax | P | m | S |
|---|---|---|---|---|---|---|
| | | | | | 3 | 4.157 |
| | | 4 | 2 | 0.739 | 2 | 0.656 |
| | | | | | 3 | 3.158 |
| | | 5 | 3 | 0.138 | 3 | 2.159 |
| | | | | | 4 | 4.660 |
| 5° | 2.5 | 1 | 1 | 0.747 | 1 | 0.642 |
| | | | | | 2 | 3.151 |
| | | 2 | 2 | 0.146 | 2 | 2.155 |
| | | | | | 3 | 4.665 |
| | | 3 | 2 | 0.544 | 2 | 1.159 |
| | | | | | 3 | 3.669 |
| | | 4 | 2 | 0.943 | 2 | 0.163 |
| | | | | | 3 | 2.672 |
| | | 5 | 3 | 0.341 | 3 | 1.676 |
| | | | | | 4 | 4.186 |

In the case of a TFT using a single gate in which a major axis directional crystal grain size is 4 μm, and an active channel length is 10 μm, the probability P in which the maximum number of fatal crystal grain boundaries is included in active channel regions is 0.5 from the Expression 1. Therefore, characteristics of the TFT are extremely non-uniform depending on the positions since the probability Q in which the number of two fatal crystal grain boundaries is included in the active channel regions is 0.5 from the Expression 2. Mobility of the TFT and improvement of TFT characteristics are limited in an active matrix display device since the fatal crystal grain boundaries are included in the active channel regions.

Figure 9:
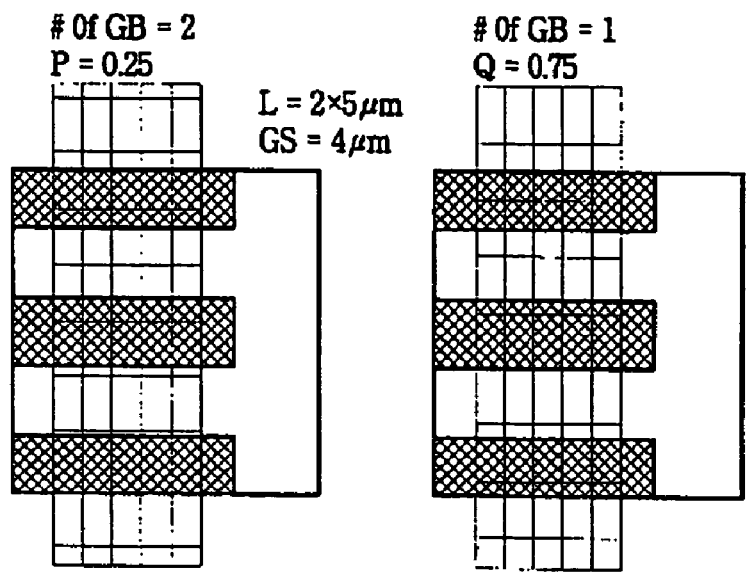
FIG. 9 and FIG. 10 are drawings illustrating a variation of the number of fatal crystal grain boundaries according to design of a TFT in TFT fabrication processes according to an embodiment of the present invention.

In this case, each TFT is constructed of two active channels, and the length of each of the active channels is 5 μm so that the number of fatal crystal grain boundaries will be one or two when fabricating dual gate TFTs having 10 μm of the same channel length using an equal polycrystalline silicon having 4 μm of size of crystal grains (FIG. 9). This means that the number of crystal grain boundaries exerting a fatal influence on TFT characteristics as compared to a single gate TFT is decreased. Therefore, overall TFT characteristics, for example, on-current characteristics are improved so that field effect mobility, etc. is expected to be substantially increased.

However, in the case of TFTs consisting of dual or multiple gates, one fatal crystal grain boundary is included in a first active channel region, and two fatal crystal grain boundaries are included in a second active channel region, as in FIG. 9, or each one and one, two and one and two and two fatal crystal grain boundaries of different combinations can be included in the first and second active channel regions respectively. This can cause non-uniformity of TFT characteristics.

Figure 10:
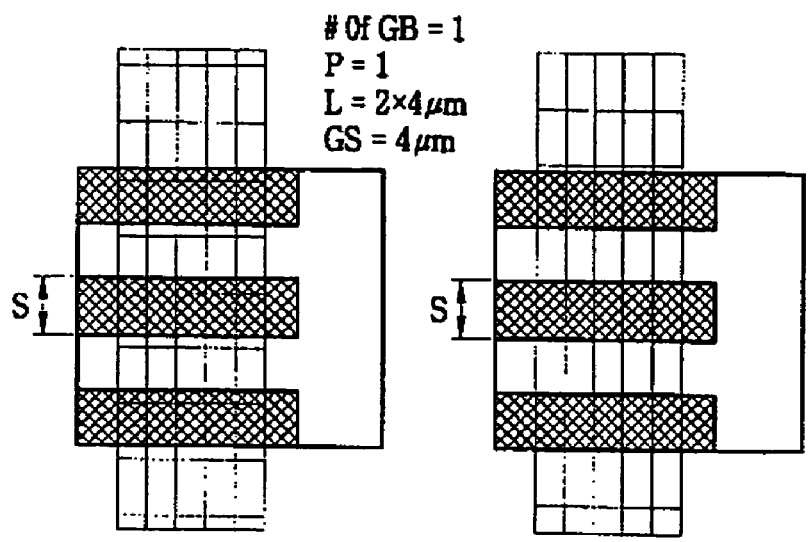

Uniformity of TFTs in the local region can be secured by using polycrystalline silicon regions of the same size of crystal grains and synchronizing the number of fatal crystal grain boundaries included in each active channel region of the respective dual or multiple gate TFTs in a region that is equally aligned during the gate electrode forming process when fabricating TFTs by proceeding designing and processes of the TFTs so that gaps between adjacent active channels satisfies the Expression 1. However, the probability in which different numbers of fatal crystal grain boundaries is included in each channel region still exists depending on crystal grain boundaries, the direction of fatal crystal grain boundaries and the dimension of active channels for the source/drain, and a fatal influence is exerted on the uniformity of the TFTs on the total substrate or within the selected region of the substrate, wherein uniformity of the TFTs can be established by applying an active channel length (in case of 2×4 μm) in which the number of fatal crystal grain boundaries on the total substrate or within the selected region of the substrate is one by the Expression 3 (FIG. 10). That is, it is possible that TFT characteristics are improved, TFTs for securing complete TFT uniformity for given size of crystal grains can be designed, and uniformity according to process margins can be predicted and monitored even during processes by using Expressions 1 and 3.

A fabrication process of a TFT according to the present invention can secure superior TFT characteristics and uniformity when fabricating a TFT for an active matrix display device using polycrystalline silicon having uniform direction and constant size of crystal grains.

Although a few preferred embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A method of fabricating a TFT using dual or multiple gates comprising:

calculating a probability including Nmax (the maximum number of crystal grain boundaries in active channel regions according to the length of the active channels); and adjusting a gap between the active channels capable of synchronizing the number of the crystal grain boundaries in each active channel region of the TFT using the dual or multiple gates in the case where Gs, the size of crystal grains of polycrystalline silicon forming a TFT substrate, θ angle in which the "primary" crystal grain boundaries are inclined at a direction perpendicular to an active channel direction of the gates, the width of the active channels and the length of the active channels are determined.

2. The method of claim 1, wherein the probability is calculated as follows:

$$P=(D-(Nmax-1)\times Gs)/Gs$$

where $D=L\cos\theta+W\sin\theta$, L is the length of active channels of the TFT, W is the width of the active channels of the TFT, Nmax is the maximum number of "primary" crystal grain boundaries that can be contained in the active channel regions of a TFT having the length L and the width W, Gs is the size of crystal grains, θ is an angle in which the "primary" crystal grain boundaries are inclined at a direction perpendicular to an active channel direction of the TFT, m is an integral number greater than 0, and W is the width of each active channel of the TFT having the dual or multiple gates.

3. The method of claim 2, wherein the gap between the active channels is calculated as follows:

$$S=mGs\cdot\sec\theta-L$$

where Gs is the size of crystal grains, θ is an angle in which fatal crystal grain boundaries ("primary" crystal grain boundaries) are inclined at a direction perpendicular to an active channel direction, and L is the length of each active channel of each of dual or multiple gates.

4. The method of claim 3, wherein the angle is $-45°\leq\theta\leq45°$.

5. The method of claim 1, wherein the gap between the active channels is calculated as follows:

$$S = mGs \cdot \sec \theta - L$$

where Gs is the size of crystal grains, θ is an angle in which fatal crystal grain boundaries ("primary" crystal grain boundaries) are inclined at a direction perpendicular to an active channel direction, and L is the length of each active channel of each of dual or multiple gates.

6. The method of claim 5, wherein the angle is $-45° \leq \theta \leq 45°$.

7. The method of claim 5, wherein the gap between the active channels is adjusted so that the probability is not 0.5.

8. A method of fabricating a TFT using dual or multiple gates comprising:

calculating a first probability in which Nmax, the maximum number of "primary" crystal grain boundaries capable of judging uniformity in TFT characterstics during fabrication of a TFT substrate using large silicon grains are included in active channel regions on the total substrate of a display device; and using dual or multiple gates using the first probability to judge optimum process conditions on size and direction of silicon crystal grains and optimum dimensions of the active channels to secure uniformity of the TFT characteristics.

9. The method of claim 8, wherein the probability is calculated as follows:

$$P = (D - (N\max - 1) \times Gs)/Gs$$

where D=L cos θ+W sin θ, L is the length of active channels of the TFT, W is the width of the active channels of the TFT, Nmax is the maximum number of "primary" crystal grain boundaries that can be contained in the active channel regions of a TFT having the length L and the width W, Gs is the size of crystal grains, θ is an angle in which the "primary" crystal grain boundaries are inclined at a direction perpendicular to an active channel direction of the TFT, m is an integral number greater than 0, and L is the length of each active channel of the TFT having the dual or multiple gates.

10. The method of claim 9, wherein the gap between the active channels is calculated as follows:

$$S = mGs \cdot \sec \theta - L$$

11. The method of claim 10, wherein the angle is $-45° \leq \theta \leq 45°$.

12. The method of claim 8, wherein the gap between the active channels is calculated as follows:

$$S = mGs \cdot \sec \theta - L$$

where Gs is the size of crystal grains, θ is an angle in which fatal crystal grain boundaries ("primary" crystal grain boundaries) are inclined at a direction perpendicular to an active channel direction, and L is the length of each active of each of dual or multiple gates.

13. The method of claim 12, wherein the angle is $-45° \leq \theta \leq 45°$.

14. The method of claim 12, wherein the gap between the active channels is adjusted so that the probability is not 0.5.

15. A method of fabricating a TFT using dual or multiple gates comprising:

calculating a maximum number of crystal grain boundaries in each of active channel regions of the TFT according to a length and width of the active channel regions;

determining a major axis direction size of crystal grains;

determining an angle of inclination of the crystal grain boundaries with respect to the active channel direction of the gates; and adjusting a gap between the active channel regions to determine the maximum number of crystal grain boundaries in each of the active channel regions based on the calculated maximum number of crystal grain boundaries, the determined major axis, the determined angle of inclination and the determined width and length of the active channel regions.

* * * * *

UNITED STATES PATENT AND TRADEMARK OFFICE
CERTIFICATE OF CORRECTION

| | | |
|---|---|---|
| PATENT NO. | : 7,011,992 B2 | Page 1 of 1 |
| APPLICATION NO. | : 10/677278 | |
| DATED | : March 14, 2006 | |
| INVENTOR(S) | : Ki Yong Lee | |

It is certified that error appears in the above-identified patent and that said Letters Patent is hereby corrected as shown below:

Title Page, Item (57), Abstract, replace the Abstract in its entirety with the Abstract below.

--A method of fabricating a TFT using dual or multiple gates, and a TFT having superior characteristics and uniformity by providing a method of fabricating a TFT using dual or multiple gates by calculating the probability including Nmax, the maximum number of crystal grain boundaries in active channel regions according to the length of the active channels, and adjusting a gap between the active channels capable of synchronizing the number of the crystal grain boundaries in each active channel region of the TFT using the dual or multiple gates in the case where Gs, the size of crystal grains of polycrystalline silicon forming a TFT substrate, $\theta$ angle in which "primary" crystal grain boundaries are inclined at a direction perpendicular to an active channel direction of the gates, the width of the active channels and the length of the active channels are determined.--

Column 12, line 4, change "claim 9" to --claim 8--.

Column 12, line 7, insert --where Gs is the size of crystal grains, $\theta$ is an angle in which fatal crystal grain boundaries ("primary" crystal grain boundaries) are inclined at a direction perpendicular to an active channel direction, and L is the length of each active channel of each dual or multiple gates-- after "$S=mGs \cdot \sec\theta\text{-}L$".

Column 12, line 10, change "claim 8" to --claim 9--.

Column 12, line 20, change "claim 12" to --claim 10--.

Signed and Sealed this

Fourteenth Day of November, 2006

JON W. DUDAS
*Director of the United States Patent and Trademark Office*